(12) United States Patent
Tsai et al.

(10) Patent No.: US 7,105,433 B2
(45) Date of Patent: Sep. 12, 2006

(54) METHOD FOR TREATING WAFER SURFACE

(75) Inventors: Chi-Long Tsai, Taitung (TW); Min-Lung Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 420 days.

(21) Appl. No.: 10/708,425

(22) Filed: Mar. 2, 2004

(65) Prior Publication Data

US 2004/0229474 A1  Nov. 18, 2004

(30) Foreign Application Priority Data

Mar. 5, 2003 (TW) .............................. 92104615 A

(51) Int. Cl.
*H01L 21/44* (2006.01)
(52) U.S. Cl. ...................... 438/613; 438/674
(58) Field of Classification Search ........ 438/106–108, 438/612–614, 618, 648, 652, 656, 674, 685, 438/687
See application file for complete search history.

(56) References Cited

U.S. PATENT DOCUMENTS 6,593,220 B1 * 7/2003 Yu et al. ..................... 438/612

* cited by examiner

*Primary Examiner*—David Vu
(74) *Attorney, Agent, or Firm*—Jianq Chyun IP Office

(57) ABSTRACT

The present invention provides a method for treating the wafer surface, suitable for removing residues on the wafer surface. The method includes forming a photo-sensitive material layer over the wafer surface covering the bumps and the under bump metallurgy layer on the wafer surface. Using the bumps as masks, the photo-sensitive material layer is exposed and developed, to expose the wafer surface between the bumps. A wet etching process is then performed to remove residues on the exposed wafer surface and then the remained photo-sensitive material layer is removed. Therefore, no residues remain on the wafer surface, and the yield of the bumps is increased.

10 Claims, 7 Drawing Sheets

METHOD FOR TREATING WAFER SURFACE

CROSS REFERENCE TO RELATED APPLICATIONS

This application claims the priority benefit of Taiwan application serial no. 92104615, filed Mar. 5, 2003.

BACKGROUND OF INVENTION

1. Field of Invention

The present invention relates to a method for treating a surface of a wafer. More particularly, the present invention relates to a method for removing residues on the surface of the wafer.

2. Description of Related Art

In the semiconductor industry, the manufacturing of integrated circuits (ICs) can be categorized as three stages: wafer production, IC fabrication and IC packaging. In general, the wafer is fabricated into chips through layout design, lithography/etching and wafer scribing. After completing the integrated circuits of the wafer, a plurality of bonding pads are formed on the active surface of the wafer and a passivation layer is formed to cover the active surface. The bonding pads exposed by the passivation layer are electrically connected to the external medium, for example, a package substrate or a circuit board. Taking the flip chip package as an example, after forming the bonding pads, bumps are formed on the wafer surface to electrically and mechanically connect the external package substrate or the circuit board. After the formation of bumps, the wafer is scribed into individual chip packages. Since bumps have high reliability and are arranged on the bonding pads in arrays, they are suitable to be applied in high-density flip chip packages, including flip chip/ball grid array packages.

FIGS. 1A–1G are cross-sectional display views illustrating a conventional fabrication process for forming bumps. Referring to the FIG. 1A, a wafer 110 having an active surface 112 is provided. The wafer includes bonding pads 116 and a passivation layer 114 on the active surface 112. The bonding pads 116 are exposed through openings 118 of the passivation layer 114, so that the wafer can be electrically connected to the external circuit (not shown) through the exposed bond pads.

Referring to FIG. 1B, a metal layer 130 is formed over the active surface 112 of the wafer 110, for enhancing adhesion. The metal layer 130 is a composite layer formed by either sputtering or evaporation. The material of the metal layer 130 includes titanium, tungsten, chromium, nickel, copper and the alloys thereof.

After forming the metal layer 130 on the active surface 112 of the wafer 110, a plurality of bumps are formed on the bonding pads 116 by either electroplating or screen printing.

Taking electroplating as an example, the following steps are described in FIGS. 1C–1E.

As shown in FIG. 1C, a photoresist layer 140 is formed on the metal layer 130. After lithography and developing, the photoresist layer 140 is patterned to form a plurality of openings 142 therein, while openings 142 expose a portion of the metal layer 130.

Referring to FIGS. 1D–1E, the openings 142 are filled by solder paste to form a plurality of solder (bump) paste globs 150 within the openings 142 by electroplating. The location of each solder paste glob 150 (opening) corresponds to the location of each bonding pad 116. Afterwards, the photoresist layer 140 is removed, leaving a portion of metal layer 130 between the solder paste globs 150 being exposed.

Referring to FIGS. 1F–1G, using the solder paste globs as an etching mask, a wet etching process is performed to removed the exposed metal layer 130 between the solder paste globs 150, thus forming an under bump metallurgy (UBM) layer 132. Next, a reflow step is performed, so that the solder paste glob 150 becomes a globular bump 152.

However, as shown in FIG. 1E, if some photoresist 134 is not completely removed but remained on the metal layer 130 between the solder paste globs 150, the remained photoresist 134 will cause problems in the subsequent wet etching process. Because the remained photoresist 134 covers the underlying portion of the metal layer 130, the exposed metal layer 130 between the solder paste globs 150 can not be completely removed during the wet etching process and residual metal 136 stays on the passivation layer 114 between the globs 150. The residual metal can deteriorate the yield of the wafer. On the other hand, if the wet etching process is prolonged to remove the residual metal entirely, undercut of the UBM layer 132 may occur, which likewise decreases reliability for the flip-chip packages. Therefore, it is important to remove residues of the UBM layer without degrading the UBM layer.

SUMMARY OF INVENTION

The present invention provides a method for treating the wafer surface, which can effectively remove residues on the wafer surface and increase the yield for the process.

As embodied and broadly described herein, the present invention provides a method for treating the wafer surface. A wafer having a plurality of bonding pads on its surface is provided. A plurality of bumps is formed on the bonding pads on the wafer surface, with one bump being attached to one bonding pad through the under bump metallurgy (UBM) layer. A photo-sensitive material layer is formed over the wafer surface, at least covering the UBM layer. Using the bumps as masks, the photo-sensitive material layer is patterned and developed to expose the wafer surface between the bumps. At least one wet etching process is performed to clean the exposed wafer surface, and the photo-sensitive material layer is removed.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

FIGS. 2A–2I are cross-sectional display views illustrating a method of treating the wafer surface according to one preferred embodiment of this invention.

Figure 1A:
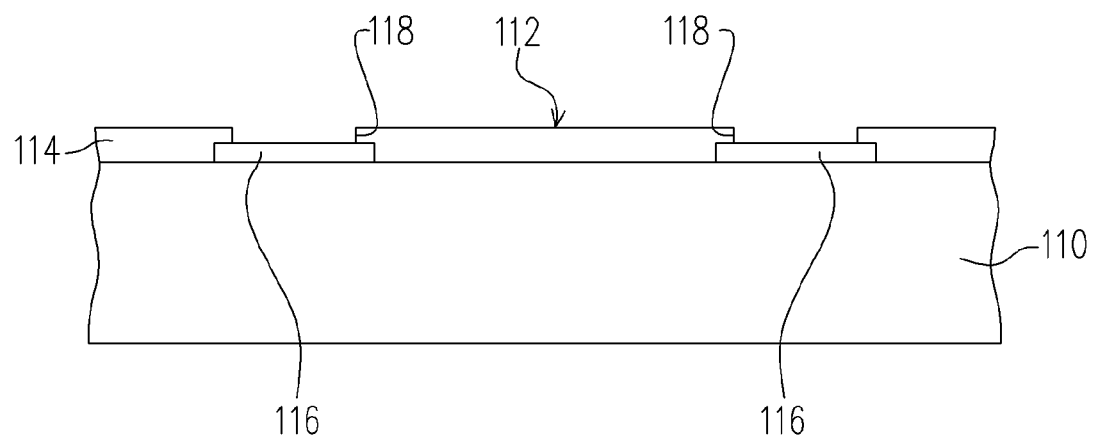
FIGS. 1A–1G are cross-sectional display views illustrating a conventional fabrication process for forming bumps.
Figure 1B:
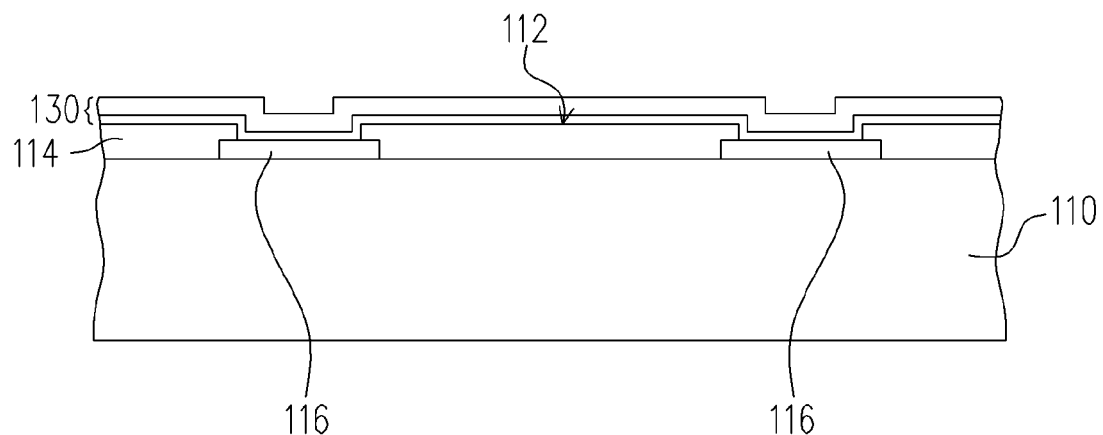
Figure 1C:
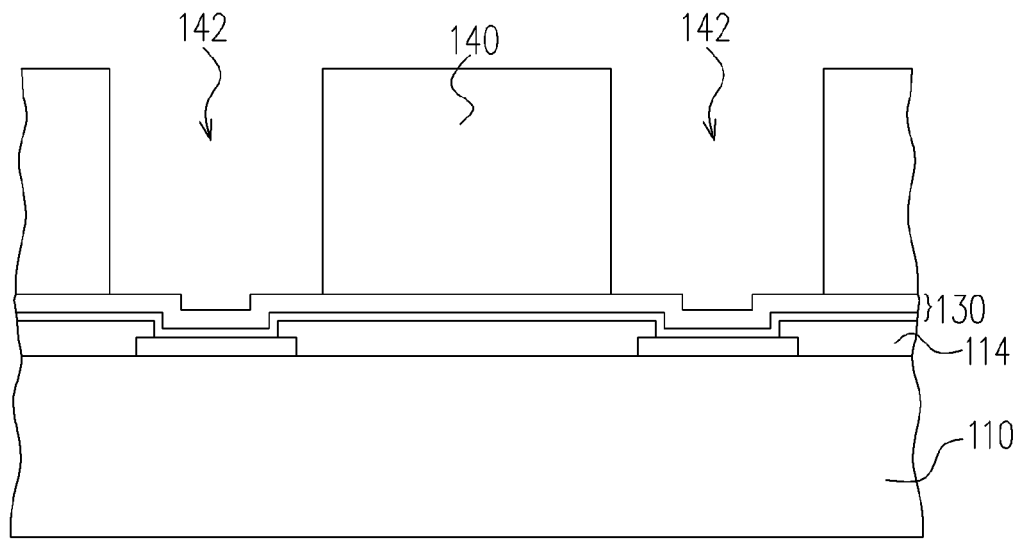
Figure 1D:
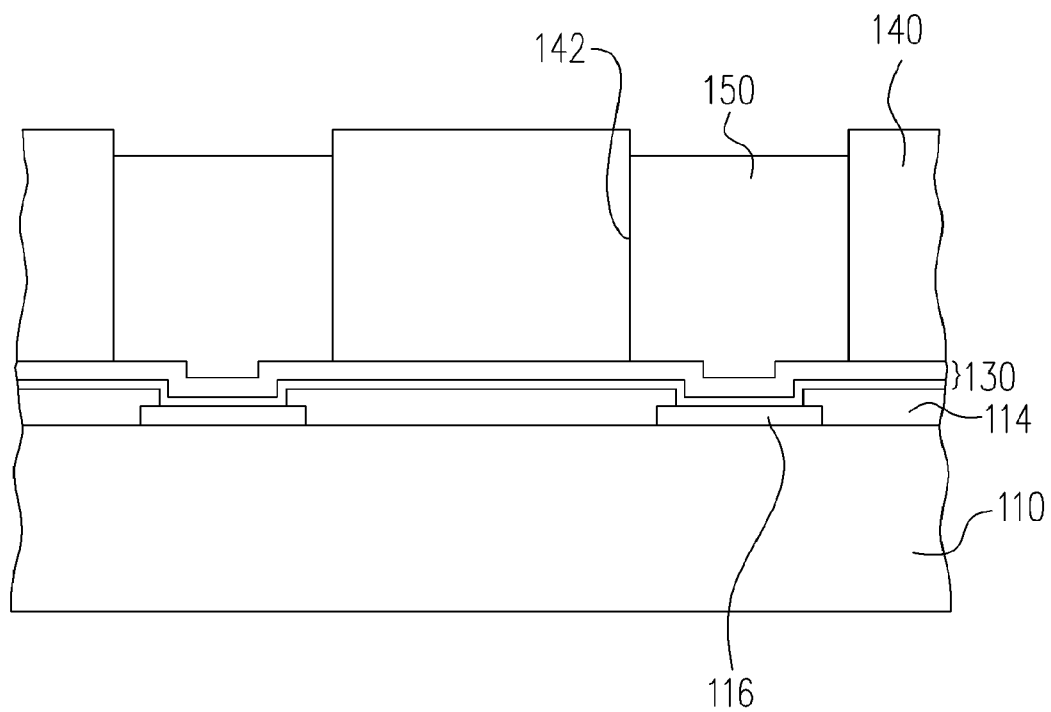
Figure 1E:
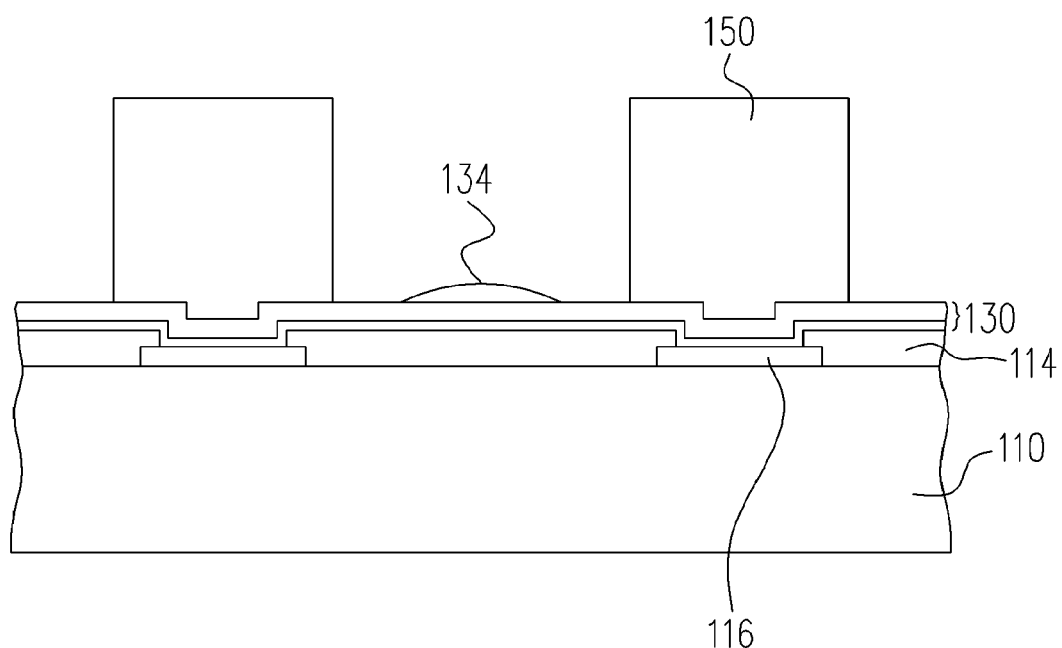
Figure 1F:
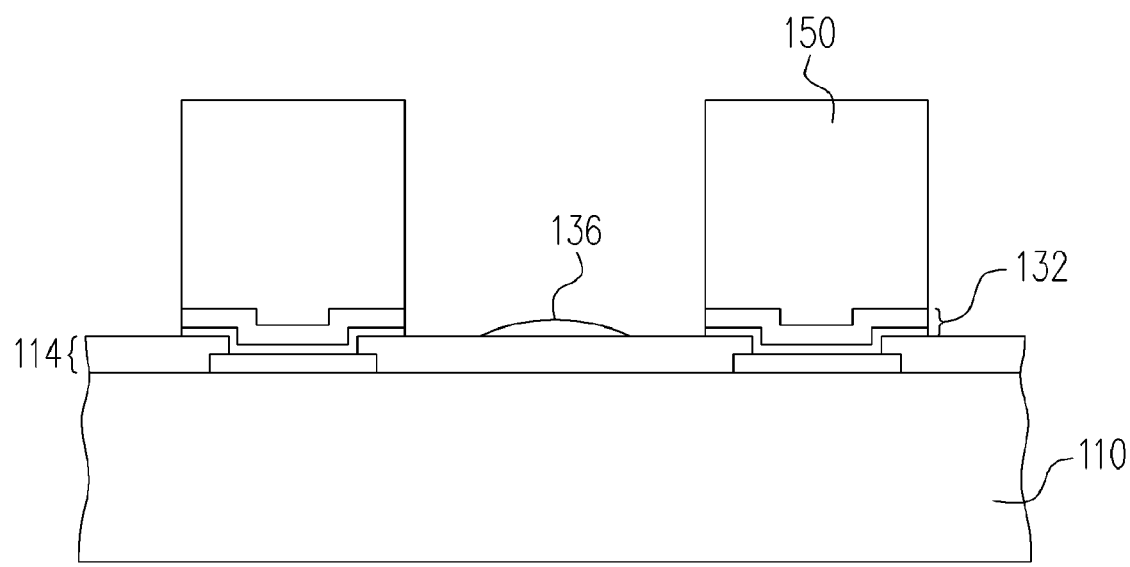
Figure 1G:
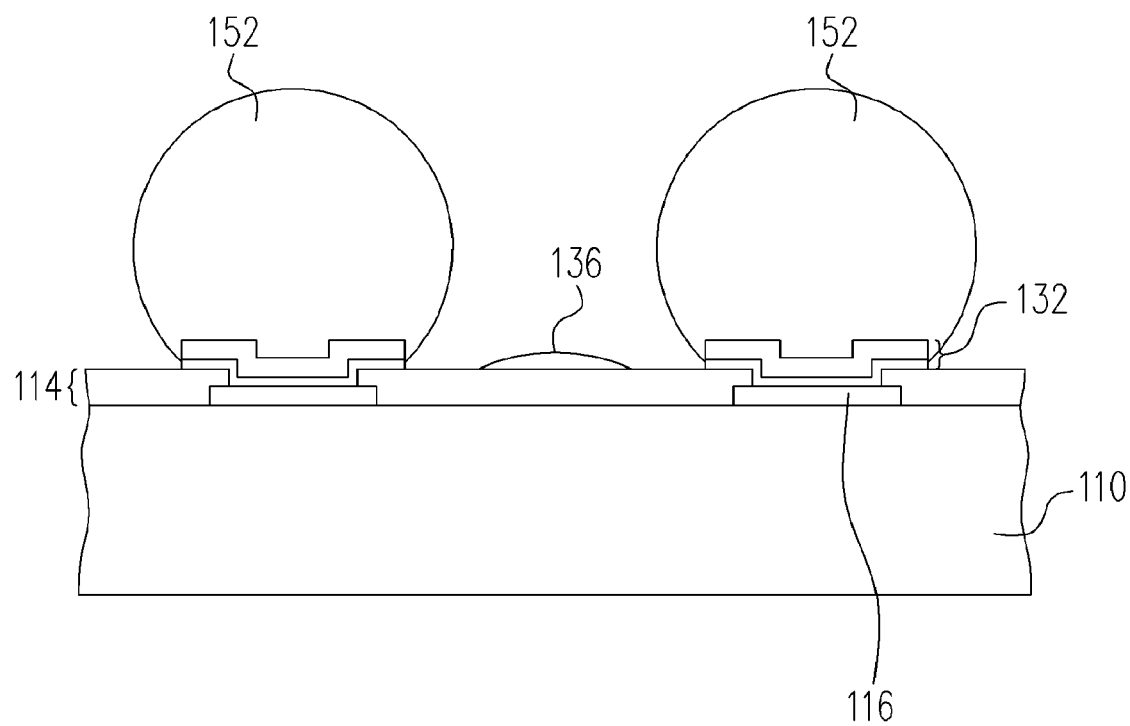
Figure 2A:
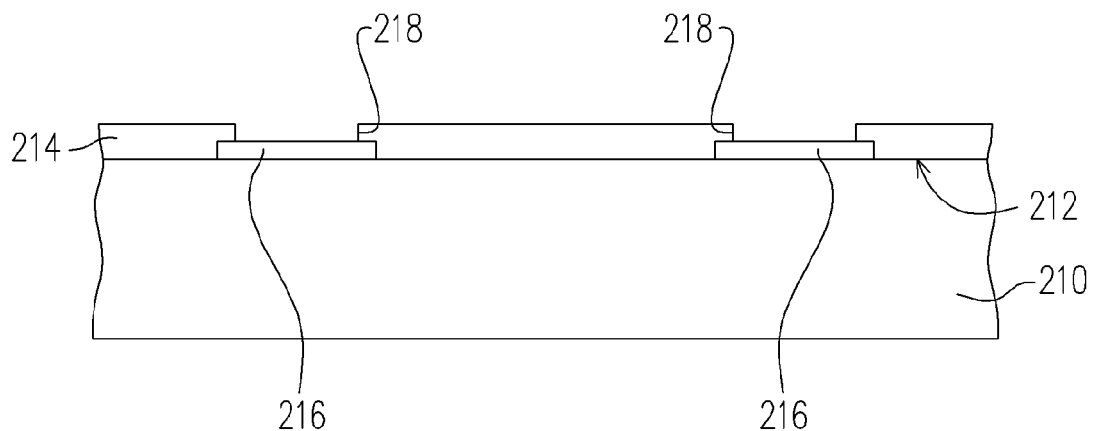
FIGS. 2A–2I are cross-sectional display views illustrating a method of treating the wafer surface according to one preferred embodiment of this invention.

Referring to FIG. 2A, a wafer 210 is provided. The wafer 210 includes a passivation layer 214 and a plurality of bonding pads 216 on a surface 212. The bonding pads 216 are exposed through openings 218 of the passivation layer 214. The material of the passivation layer 214 can be inorganic, for example, silicon nitride, silicon oxide or phospho-silicate glass, or organic, for example, polyimide.

Figure 2B:
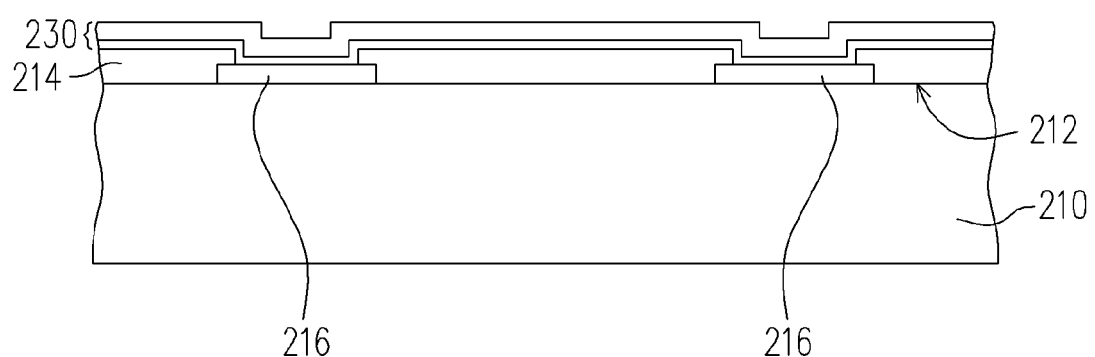
Figure 2C:
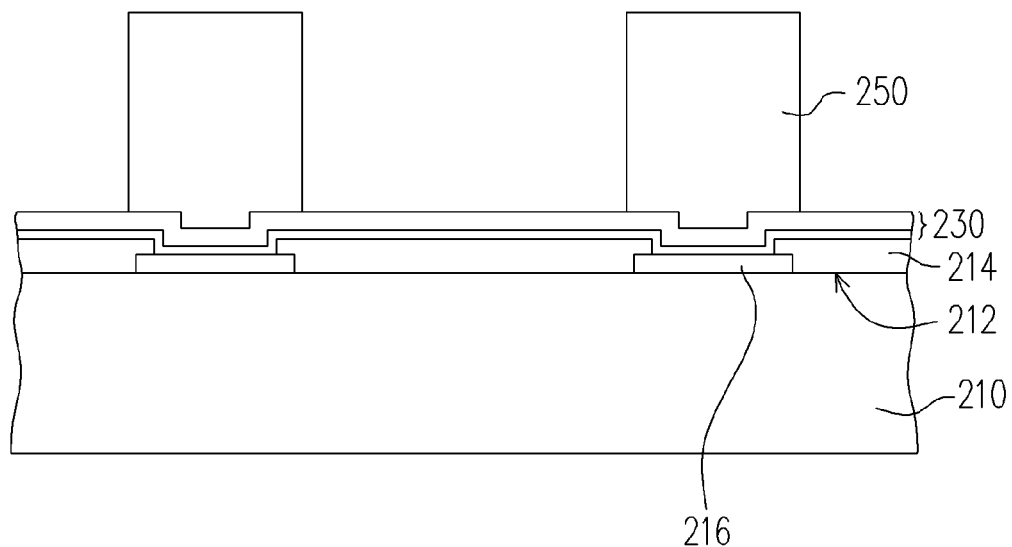
Figure 2D:
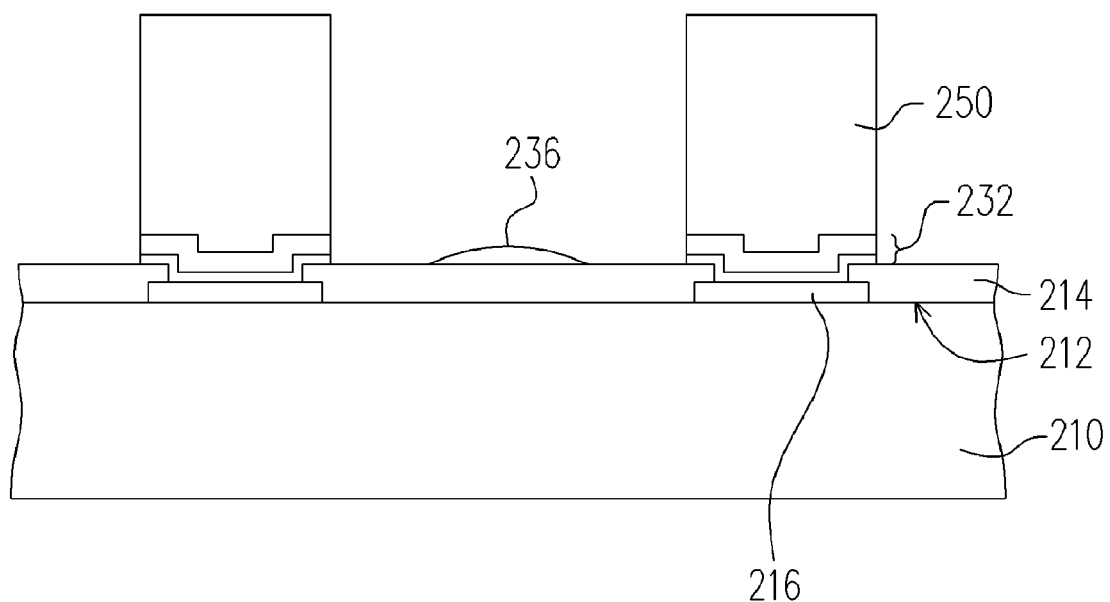

Referring to FIGS. 2B–2D, a metal layer 230 and a plurality of solder paste globs 250 are formed on the wafer 210, by those technologies available in this field. The following steps are merely exemplary, and should not be used to limit the scopes of the present invention. The metal layer 230 is a composite layer including an adhesion layer, a barrier layer, and a wetting (solder) layer (not shown), formed by either sputtering or evaporation. The material of the metal layer 230 includes titanium, tungsten, chromium, nickel, copper and the alloys thereof.

After forming the metal layer 230 on the surface 212 of the wafer 210, a plurality of bumps (solder paste globs) are formed on the bonding pads 226 by either electroplating or screen printing. Taking electroplating as an example, a patterned photoresist layer (not shown) with openings 242 (not shown) is formed on the metal layer 230. Afterwards, solder paste is filled to the openings to form a plurality of solder paste globs 250 by electroplating. The location of each solder paste glob 250 (opening) corresponds to the location of each bonding pad 216. The material of the solder paste glob can be Pb/Sn alloys, lead-free solder or gold.

Figure 2E:
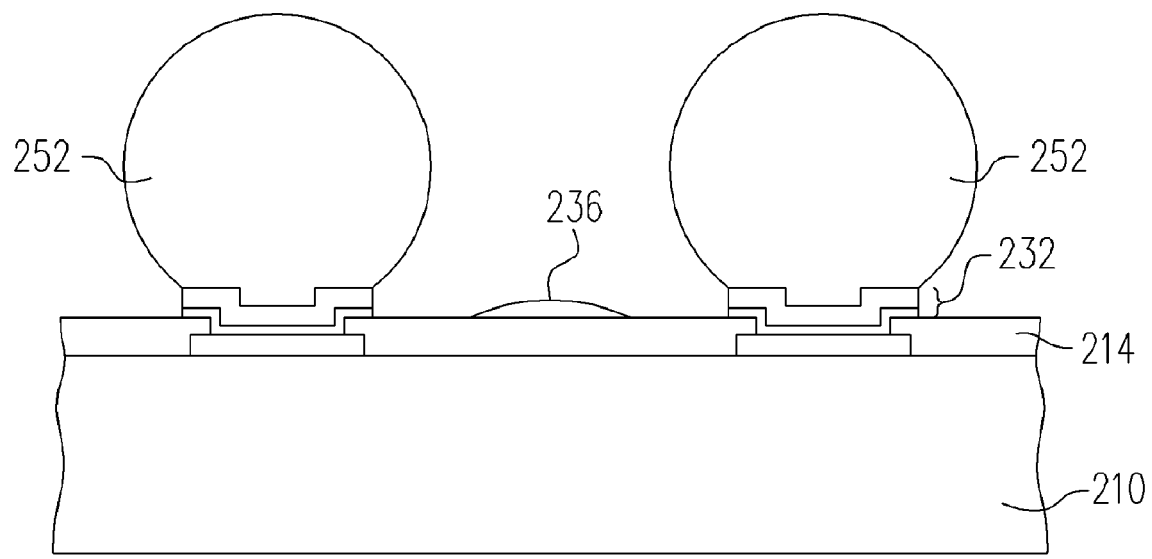

As shown in FIG. 2C, after removing the photoresist layer, a portion of metal layer 230 between the solder paste globs 250 is exposed. Referring to FIG. 2D, using the solder paste globs 250 as an etching mask, a first wet etching process is performed to removed the exposed metal layer 230 between the solder paste globs 250, thus forming an under bump metallurgy (UBM) layer 232. Next, a reflow step is performed to turn the solder paste globs 250 to globular bumps 252, as shown in FIG. 2E. The UBM layer 232 can enhance adhesion between the bumps 252 and the bonding pads 216.

Similarly, if some photoresist is remained on the metal layer 230 between the solder paste globs 250, the remained photoresist covers the underlying portion of the metal layer 230 in the first wet etching process, leading to residual metal 236 on the passivation layer 214 between the globs 250. The residual metal can deteriorate the yield of the wafer.

Figure 2F:
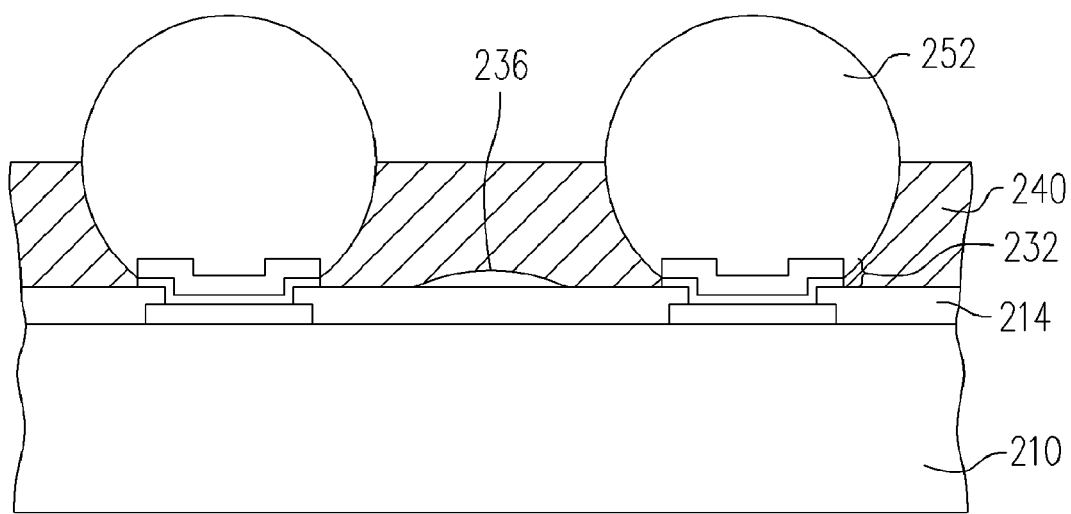
Figure 2G:
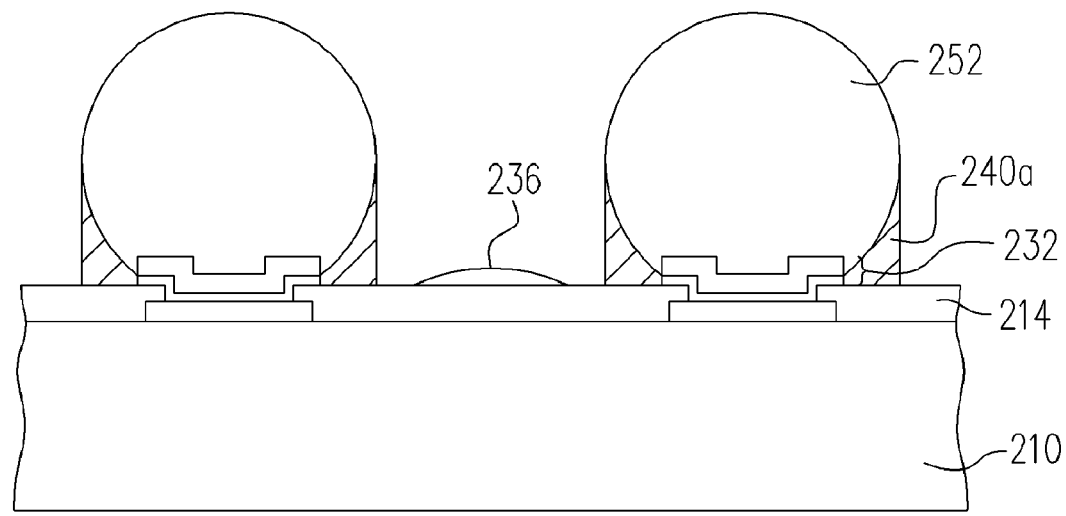

To solve this problem, after the reflow step, a photosensitive material layer 240, for example, a photoresist layer, is formed over the wafer surface 212, partially covering the bumps 252 and completely covering the underlying UBM layer 232, as shown in FIG. 2F. Referring to FIG. 2G, using the bumps 252 as masks, the photo-sensitive material layer 240 is exposed and developed, thus forming a patterned photo-sensitive material layer 240a. The patterned photosensitive material layer 240a is remained under the bumps 252 and covers the UBM layer 232, while the patterned photo-sensitive material layer 240a exposes the passivation layer 214 between the bumps 252. Using the bumps as the mask, the photo-sensitive material layer is patterned in a self-aligned way (i.e. without using a photo-mask), because a certain portion of the photosensitive material layer under the bumps is not exposed to light and is not dissolved in the developer.

Figure 2H:
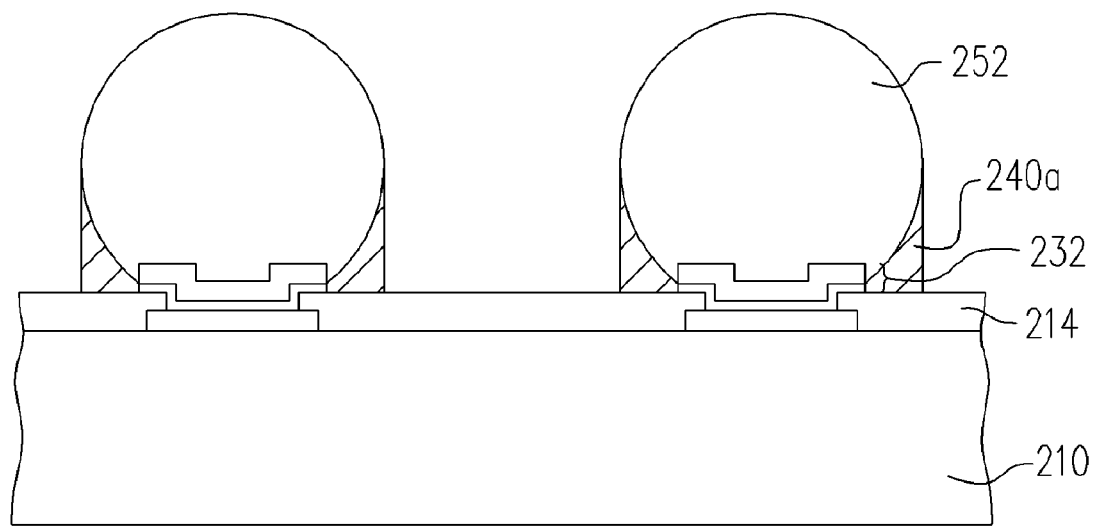
Figure 2I:
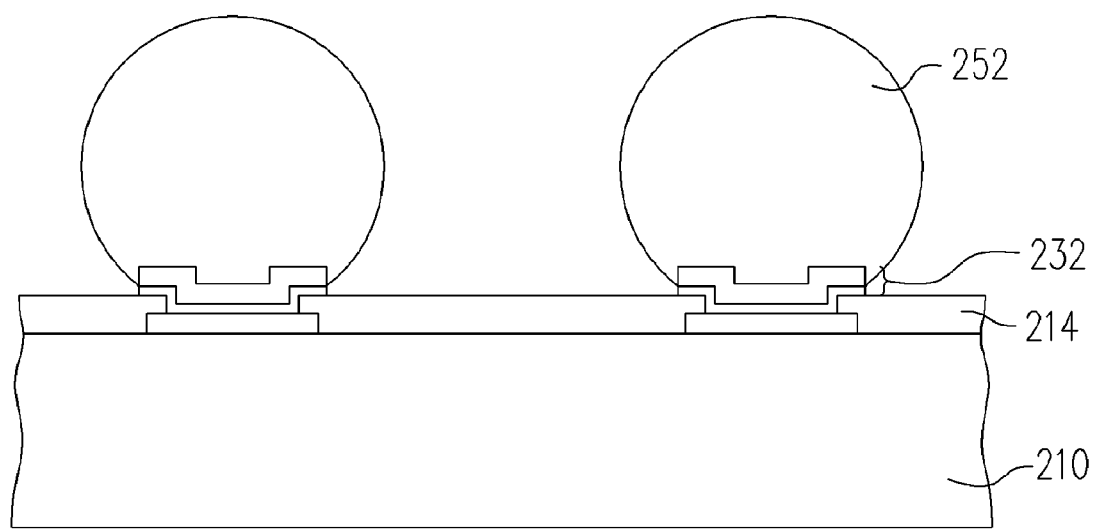

Referring to FIGS. 2H–2I, a second wet etching process is performed to remove the residues on the wafer surface, including the residual metal 236 between the bumps. The etchant can be etching agent for the UBM layer 232, for example, sulfuric acid or hydrofluoric acid. Because the UBM layer 232 is protected by the patterned photosensitive material layer 240a, no undercut will occur to the UBM layer 232. Therefore, the residues on the wafer surface are removed by the second wet etching process without over-etching or undercut. As a result, the yield is greatly increased. Then, as shown in FIG. 2I, the patterned photosensitive material layer 240a is removed by using an organic solvent or an inorganic solvent.

In addition, a flux (not shown) can be further applied to surfaces of bumps 252 to remove oxides or residues by a reflow step, and the flux is later removed by a solvent. Alternatively, the flux can be applied after the wafer is scribed into chips. In general, the flux can remove oxides on the surface of the bumps and help increase reliability of connection between the chip and the package substrate.

In conclusion, the method for treating the wafer surface in the present invention can efficiently remove residues on the wafer surface. Using the bumps as the mask, the photosensitive material layer is patterned in a self-aligned way, because a certain portion of the photosensitive material layer under the bumps is not exposed to the light and is not dissolved in the developer. Since the patterned photo-sensitive material layer completely covers the UBM layer, the second wet etching process can effectively remove residues without damaging the UBM layer. The yield of the bumping process is increased without residues or residual metal on the surface.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A method for treating a surface of a wafer, comprising:
 providing the wafer, wherein a plurality of bonding pads and a plurality of bumps are disposed on the surface of the wafer, each bump being attached to one bonding pad through an under bump metallurgy (UBM) layer;
 forming a photo-sensitive material layer over the surface of the wafer, covering the bumps and the UBM layer;
 patterning the photo-sensitive material layer by using the bumps as masks to expose the surface of the wafer between the bumps;
 performing at least a wet etching process to clean the exposed surface of the wafer; and
 removing the remained photo-sensitive material layer.

2. The method of claim 1, wherein a material for forming the photo-sensitive material layer is a positive photoresist material.

3. The method of claim 1, wherein the wet etching process includes using sulfuric acid.

4. The method of claim 1, wherein the wet etching process includes using hydrofluoric acid.

5. The method of claim 1, wherein a material of the UBM layer is selected from the following group consisting of titanium, tungsten, chromium, nickel, copper and alloys thereof.

6. The method of claim 1, wherein the step of removing the photo-sensitive material layer includes using a solvent.

7. The method of claim 1, wherein following the step of patterning the photo-sensitive material layer by using the bumps as masks, the UBM layers under the bumps are covered by the remained photo-sensitive material layer, while the surface of the wafer between the bumps is exposed.

8. The method of claim 7, wherein the step of performing the wet etching process removes residuals on the surface of the wafer.

9. The method of claim 1, wherein the wafer further includes a passivation layer and the bonding pads are exposed by the passivation layer on the surface of the wafer, and following the step of patterning the photosensitive material layer by using the bumps as masks, the UBM layers under the bumps are covered by the remained photo-sensitive material layer, while the passivation layer between the bumps is exposed.

10. The method of claim 9, wherein the step of performing the wet etching process removes residuals on the passivation layer between the bumps.

* * * * *